United States Patent
Elmufdi (10) Patent No.: US 10,409,624 B1
(45) Date of Patent: Sep. 10, 2019

(54) DATA ARRAY COMPACTION IN AN EMULATION SYSTEM

(71) Applicant: CADENCE DESIGN SYSTEMS, INC., San Jose, CA (US)

(72) Inventor: Beshara Elmufdi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 630 days.

(21) Appl. No.: 15/064,273

(22) Filed: Mar. 8, 2016

(51) Int. Cl.
*G06F 9/455* (2018.01)

(52) U.S. Cl.
CPC .................................. *G06F 9/455* (2013.01)

(58) Field of Classification Search
None
See application file for complete search history.

(56) References Cited

U.S. PATENT DOCUMENTS

| | | | | |
|---|---|---|---|---|
| 2004/0249623 | A1* | 12/2004 | Selvidge | G06F 17/5027 703/23 |
| 2007/0239422 | A1* | 10/2007 | Bershteyn | G06F 17/5027 703/28 |
| 2009/0259457 | A1* | 10/2009 | Quennesson | G06F 11/261 703/23 |
| 2016/0098504 | A1* | 4/2016 | Larzul | G06F 17/5027 716/136 |

* cited by examiner

*Primary Examiner* — Bijan Mapar
(74) *Attorney, Agent, or Firm* — Eric L. Sophir; Dentons US LLP (57) ABSTRACT

Disclosed herein are systems and methods of an emulation system. A hardware emulator of an emulation system includes one or more processors configured to generate data in an emulation cycle. Each bit of the generated data is associated with a tag. The hardware emulator may include a compaction unit configured to receive the data generated by the one or more processors, and select one or more bits from total bits of the data based on valid tags associated with the bits of the data. The hardware emulator further includes a data array comprising non-transitory machine-readable storage media configured to store the one or more bits of the data received from the compaction unit.

20 Claims, 7 Drawing Sheets

Table 1

| STEP NUMBER | PROC3 Output | PROC2 Output | PROC1 Output | PROC0 Output | Compacted Value |
|---|---|---|---|---|---|
| 0 | - | 0 | - | - | - - - 0 |
| 1 | 1 | 0 | - | - | - 1 0 0 |
| 2 | 0 | 0 | - | - | - - - 0 0 1 0 0 |
| 3 | - | 0 | 0 | - | - 0 0 0 0 1 0 0 |
| 4 | 1 | 0 | - | - | - - - 1 0 0 0 0 0 1 0 0 |
| 5 | - | 0 | - | - | - - 0 1 0 0 0 0 0 1 0 0 |
| 6 | 1 | 0 | 0 | - | - - - 1 0 0 0 1 0 0 0 0 0 0 1 0 0 |
| 7 | 1 | 0 | 1 | - | 1 0 1 0 0 0 0 1 0 0 0 0 0 0 1 0 0 |

FIG. 4A

Table 3

| ADDRESS | DATA |
|---|---|
| 0 | 0 1 0 0 |
| 1 | 0 0 0 0 |
| 2 | 0 0 0 1 |
| 3 | 1 0 1 0 |

FIG. 4C

Table 2

| ADDRESS | DATA |
|---|---|
| 0 | - 0 - - |
| 1 | 1 0 - - |
| 2 | 0 0 - - |
| 3 | - 0 0 - |
| 4 | 1 0 - - |
| 5 | - 0 - - |
| 6 | 1 0 0 - |
| 7 | 1 0 1 - |

FIG. 4B

DATA ARRAY COMPACTION IN AN EMULATION SYSTEM

TECHNICAL FIELD

This application relates generally to emulation systems, and more specifically to data array of hardware emulators.

BACKGROUND

Hardware emulators are programmable devices used in the verification of hardware designs. Hardware emulators may include hardware components capable of processor-based (e.g., hardware-based) emulation of logic systems, such as application specific integrated circuits (ASICs), central processing units (CPUs), graphics processing units (GPUs), and the like. By executing various forms of programmable logic, the hardware emulators may be programmed to mimic the functionality of nearly any prototype logic system design such as an integrated circuit, an entire board of integrated circuits, or an entire system that is undergoing testing. This mimicking of functionality allows logic system designers to prototype their logic system design using processor-based emulation before actually manufacture the logic system, such as an ASIC product, thereby potentially saving millions of dollars by avoiding design failures.

A hardware emulator may be comprised of multiple processors. These processor-based emulators sequentially evaluate combinatorial logic levels, starting at the inputs and proceeding to the outputs. Each pass through the entire set of logic levels is known as a cycle, and the evaluation of each individual logic level is known as an emulation step. During each process cycle, each processor is capable of emulating a logic gate, mimicking the function of a logic gate in an integrated circuit. The processors are arranged to compute results in parallel, in the same way logic gates present in an integrated circuit compute many results in parallel. This creates a chain of logic similar to what occurs in an integrated circuit. In the chain of logic, efficient communication between processors is crucial.

The programs executed by the processors in a hardware emulator may include instructions containing a sequence of operations. The processor typically corresponds to an instruction memory that is read sequentially and provides instructions that are used to read bits out of a data array. Each processor is connected to the data array that is a special memory, and has multiple read ports and supplies input data to the processor via each read port. The processor evaluates the data supplied from the data array in accordance with an instruction word supplied from an instruction memory. The processor does not always require input data from all of the read ports of the data array. The bits that are read from the data array are then fed to a lookup table (LUT) that is controlled by the instruction, and the result of the LUT function is then stored back into the data array. The data array also contains the results of previous LUT evaluations. The data array may also store inputs that come from outside the processor (from other processors of the hardware emulator), and therefore the LUT not only has access to all previous results, but also values from outside the processor.

The data array stores outputs of the processor for an emulation cycle (in a single phase) and serves as the inputs to the processor. The data value produced by the processor may then be written to the data array at an address indicated by a step number of a current instruction. For example, a result of the instruction executed at step 100 is stored in the data array at address 100. Currently, the processor outputs are written every step in the data array even if the processors did not do any useful computation. For example, in a design with an emulation cycle that has 500 steps, a processor may produce only 200 useful outputs, but due to the current configuration, the data array must do 500 writes of the processor outputs although only 200 are really needed. Because of this existing configuration, there is a waste of memory space of the data array as well as power since the outputs that are not useful are also being written into the data array.

Thus, there is a need in the art for a hardware emulator having improved space utilization of the data array.

SUMMARY

Disclosed herein are systems and methods of a programmable emulation system to execute an emulation process, to emulate a logic system, such as an application-specific integrated circuit (ASIC), currently being tested and prototyped. The emulation system includes a compaction unit that filters data to be stored in a data array. The processor outputs (including any non-useful computations) for an emulation cycle of N number of steps (where N is an integer) are written every step in the compaction unit. The compaction unit filters the bits of the data that are valid, and writes the valid bits of the data into the data array. Such a configuration allows increased number of valid bits of the data to be stored in the data array in each emulation cycle without increasing a size of the data array.

In one embodiment, a hardware emulator of an emulation system includes one or more processors configured to generate data in an emulation cycle. Each bit of the data is associated with a tag. The hardware emulator includes a compaction unit configured to receive the data generated by the one or more processors, and select one or more bits from total bits of the data based on valid tags associated to the one or more bits of the data. The hardware emulator further includes a data array comprising non-transitory, machine-readable storage media configured to store the one or more bits of the data received from the compaction unit.

In another embodiment, a processor-implemented method for transfer of data in an emulation system. The method includes generating, by one or more processors, data in an emulation cycle, each bit of the data is associated with a tag. The Method includes receiving, by a compaction unit, the data generated by the one or more processors. The method includes selecting, by the compaction unit, one or more bits from total bits of the data based on valid tags associated to the one or more bits of the data. The method includes transmitting, by the compaction unit, the one or more bits of the data in a data array comprising non-transitory, machine-readable storage media. The data array stores the one or more bits of the data received from the compaction unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Emulation chips disclosed herein are capable of performing programmatic logic functions used for hardware-based (e.g., processor-based) logic system emulation, which may allow for prototyping ASICs or other logic systems before actual production of the particular ASIC or logic system product. During execution of an emulation test, the programmatic logic may be executed by processors of the emulation chips. The programmatic logic executed by the processors in a hardware emulator consist of instructions containing a sequence of operations. The processor corresponds to an instruction memory that is read sequentially, and provides instructions that are used to read bits out of a data array. The processor may include multiple input ports for receiving data from the data array, and then evaluate the data supplied from the data array in accordance with an instruction word supplied from an instruction memory. The bits of data that are read from the data array are fed to a lookup table (LUT) that is controlled by the instruction. The result of the LUT function is sent by an output port of the processor to a compaction unit. The result of the LUT function may include useful and non-useful outputs. For example, in a design with an emulation cycle that has 100 steps, the processor may produce only 30 useful and valid outputs. The compaction unit selects valid bits of data from total data received from the processor, and then transmits the valid bits of the data to the data array. Such a configuration allows that the data array to store only valid bits of data. Thus, the use of the compaction unit allows the data array of present disclosure to store valid bits of the data for 20 percent or more instructions in comparison to conventional techniques employed to store data in the data array per instruction for the same size of the data array.

Reference will now be made to the exemplary embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to one skilled in the relevant art and having possession of this disclosure, are to be considered within the scope of the invention.

Figure 1A:
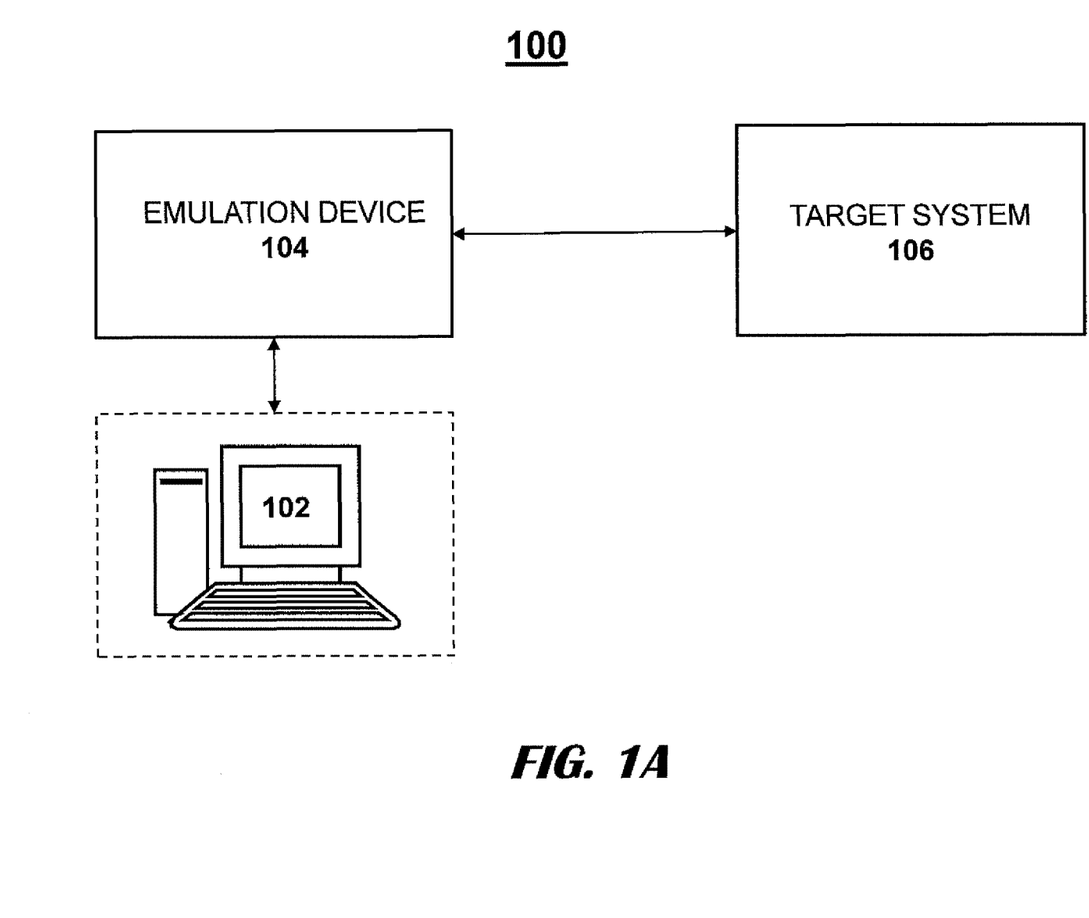
FIG. 1A is a schematic diagram showing components of an emulation system, according to an exemplary embodiment.

FIG. 1A is a schematic diagram showing components of an emulation system 100, according to an exemplary embodiment. The emulation system 100 includes a computer workstation 102, an emulation device 104, and a target system 106.

The computer workstation 102 provides emulation support facilities to the emulation device 104. The computer workstation 102 may include at least one central processing unit (CPU), support circuits, and a memory. The CPU may include one or more microprocessors and/or microcontrollers. The support circuits may be circuits that are used to support the operation of the CPU. These circuits may include power supplies, docks, input/output interface circuitry, cache and the like. The computer workstation 102 may further include a memory that may comprise random access memory, read only memory, removable disk memory, flash memory, optical storage and various combinations of these types of memory. The memory may be a main memory and may in part be used as cache memory or buffer memory. The memory stores various forms of software and files, such as an operating system (OS) and a compiler.

The computer workstation 102 allows a user to interface with the emulation device 104, control the emulation process and collect emulation results for analysis. Under control of the computer workstation 102, programming information and data is loaded to the emulation device 104.

The emulation device 104 may be a collection of computing hardware capable of executing the emulation processes. The emulation device 104 is composed of individual emulation circuits. Typically, the emulation circuits are integrated circuits (also referred to herein as emulation chips). The emulation device 104 include racks housing emulation logic boards, emulation processors, and other computing hardware designed to emulate the designs of prototype application-specific integrated circuits (ASICs) and/or other logic systems. In some embodiments, the emulation device 104 may include a server computer having separate processors, which may execute software modules configured to manage and control the resources and performance of the emulation system 100. Non-limiting examples of these software modules may include a compiler and a configuration manager stored in the memory. The emulation device 104 may be composed of individual emulation circuits. Typically, the emulation circuits are integrated circuits (also referred to herein as emulation chips).

A compiler may be a software module, which may be executed by the computer workstation 102 or on the emulation device 104, and is configured to receive and compile a netlist design file containing the logical gate design of an ASIC or other logic system, and then generates a virtual logic file based on the compiled netlist. The compiler may "map" logic of the ASIC (or other logic system) into the hardware components of the emulation system 100 to generate instructions for the emulation system's 100 components to function as the emulated ASIC or other logic system. The compiler may comprise a partitioner and scheduler component or function, though it should be appreciated that the compiler may be segmented into any number of component software modules. In an opening import phase, the compiler receives the netlist and begins compiling. Here, the compiler may parse the logic gates of the netlist into a database format. The partitioner may determine which part of the netlist is going to be executed by which type and which instance of hardware resource of the emulation system 100. Then, a scheduler may determine for that part of the netlist which of the hardware resources should execute the part of the netlist and when in the execution cycle that logic component (e.g., gate, instruction) should be executed. The compiler may be capable of determining the status of components of the emulation system 100, including the allocation status of particular components or whether the resource is inoperable (e.g., marked-out).

A configuration manager may be software module, which may be executed by the computer workstation 102 or on the emulation device 104, and is configured to track the status and control the task performed of components of the emulation system 100. The configuration manager may determine which components of the emulation system 100 are available or unavailable to receive parts of the virtual logic generated by the compiler. In some cases, the configuration manager continuously polls or self-tests the emulation system 100 for faulty hardware components. The configuration manager may then update records of the components stored in a database.

In response to the programming received from the emulation support facilities, the emulation device 104 emulates a portion of the target system 106. The portion of the target system 106 may be an integrated circuit, a memory, a processor, or any object or device that can be emulated in a programming language. The emulation programming languages include Verilog and VHDL.

Figure 1B:
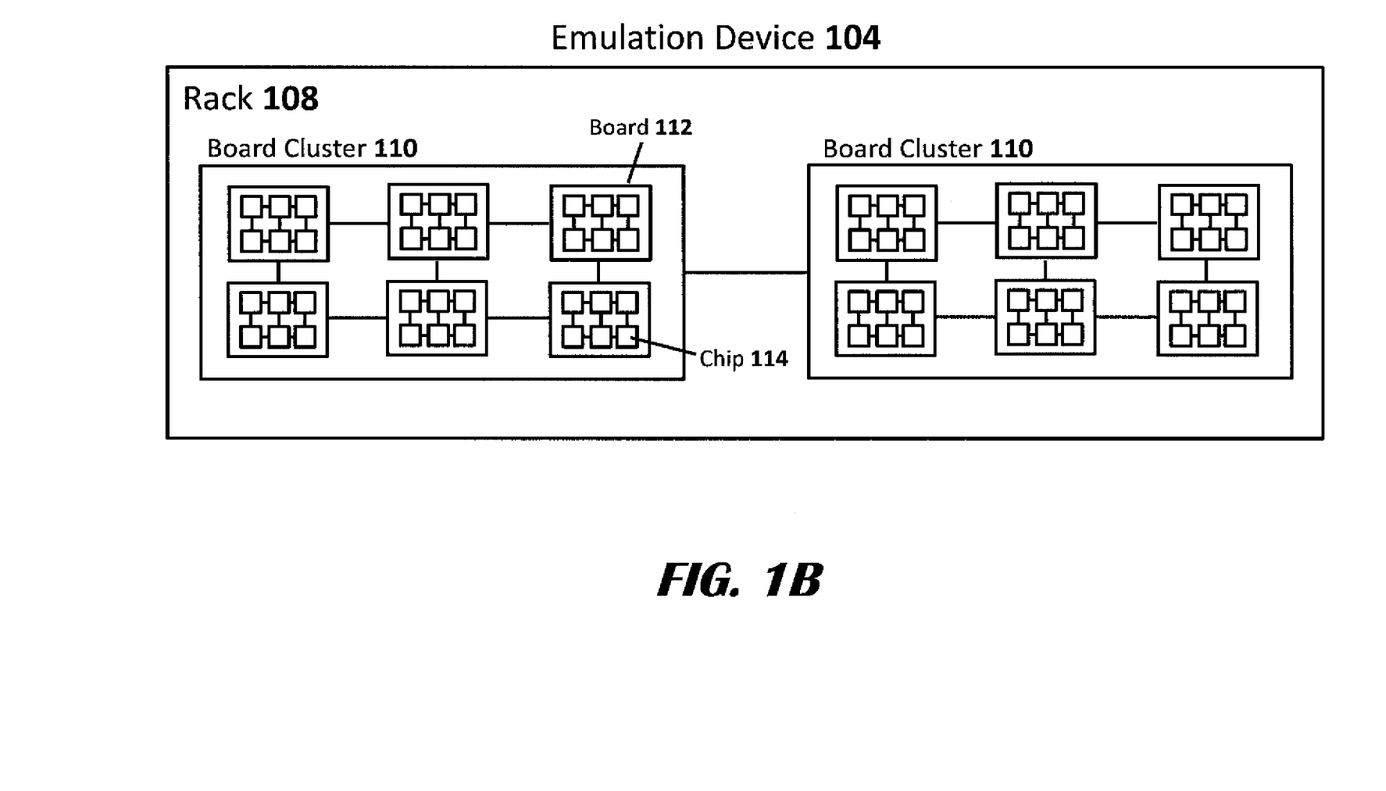
FIG. 1B is a schematic diagram showing components of an emulation device of an emulation system, according to an exemplary embodiment.

FIG. 1B is a schematic diagram showing components of an emulation device 104 of an emulation system 100, according to the exemplary emulation system shown in FIG. 1A. The emulation device 104 of the emulation system 100 may comprise racks 108, board clusters 110, logic boards 112, emulation chips 114, and buses of various types carrying data signals between the various components of the emulation system 100.

A rack 108 may be any physical housing for components of an emulation system 100. In the exemplary emulation system 100, the rack 108 houses a plurality of emulation logic boards 112 that are organized into board clusters 110. In the exemplary emulation system 100, there is only one rack 108, however some other embodiments may comprise a plurality of racks 108. In some cases, the rack 108 may be a computing device, such as a server computer or workstation computer, configured to implement various emulation functions. The rack 108 may physically house components of any type, such as board clusters 110, emulation logic boards 112, emulation chips 114, and buses hosting data signal communications.

Board clusters 110 may be logical and/or physical collectives of one or more logic boards 112. Logic boards 112 may be clustered for any number of reasons, such as creating proximity among a set of boards 112 for more efficient signal transfer and processing between the boards 112 of the cluster 110. It should be appreciated that clustering logic boards 112 is often a design consideration, and, as such, other embodiments may cluster and/or disaggregate logic boards 112 according to any number of different organizational patterns. As shown in FIG. 1B, the exemplary emulation system 100 comprises two board clusters 110, each of the board clusters 110 comprises six logic boards 112. The board clusters 110 may be interconnected with one another by buses, which may carry data signals transmitted to and from the board clusters 110. Likewise, buses may interconnect the logic boards 112 of a particular board cluster 110, so that the logic boards 112 may transmit and receive data signals to and from other logic boards within the same board cluster 110.

Emulation logic boards 112 comprise computing hardware components capable of emulation functionality to emulate the design and functions of an ASIC or other circuitry; non-limiting examples of emulated logic systems might include application-specific integrated circuits (ASICs), central processing units (CPUs), graphics processing units (GPUs), and arithmetic processing units (ALUs), among others. The logic board 112 may comprise one or more emulation chips 114 performing the functions needed for emulation, and one or more buses interconnecting the emulation chips 114. The buses may be an optical, copper, or any other conductive material capable of carrying data signals. In operation, the buses may carry data signals transmitted to and from the emulation chips 114 of the logic board 112. In some cases, the logic board 112 may comprise one or more buses supporting communication between emulation chips 114 on the same logic board 112 (e.g., intra-board communication); and, in some cases, the logic board 112 may comprise one or more buses supporting communication between emulation chips 114 located on other logic boards 112 of the system 100 (e.g., inter-board communication).

Emulation chips 114 may comprise any number of processors capable of performing the various tasks and processes for emulating an ASIC or other logical processing circuitry, multiplexers configured to direct data signals to and from the processors, buses for communicating data between the processors, and data lanes connecting the components of a processor. An emulator chip 114 may be designed to mimic the functionality of any ASIC or other logic system design, based on programmable logic that configures the emulator chip's 114 behavior to mimic the particular ASIC. Circuitry designers may prototype new ASIC designs using processor-based emulation before actually manufacturing the ASIC and emulation device 104. The emulation chips 114 may receive a set of instructions to execute from a compiler, which may be a software module component executed by a computing device coupled to the system 100. In operation, the compiler compiles a netlist file representing the ASIC's design. The result of compiling the netlist generates virtual logic comprising instruction sets for the components (e.g., multiplexers, Boolean processors) of the emulator chips 114.

In some embodiments, the processors of the emulator chip 114 may be organized into any number of processor clusters (not shown) to efficiently share data inputs, data outputs, and data references (e.g., calls to stored data in a data array). For example, multiple processors of the emulator chip 114 may be clustered together such that the processors reference the same data array and/or instruction store. It should be appreciated that, due the modular nature of the components of the emulation system 100, components such as the processors may be organized into any number of additional or alternative organizational patterns. In some cases, clusters of processors may be clustered into clusters of clusters. However, it should be appreciated that organizational patterns are not required, and thus, in some embodiments, processors of the emulator chip 114 may not be organized into clusters at all.

Figure 2A:
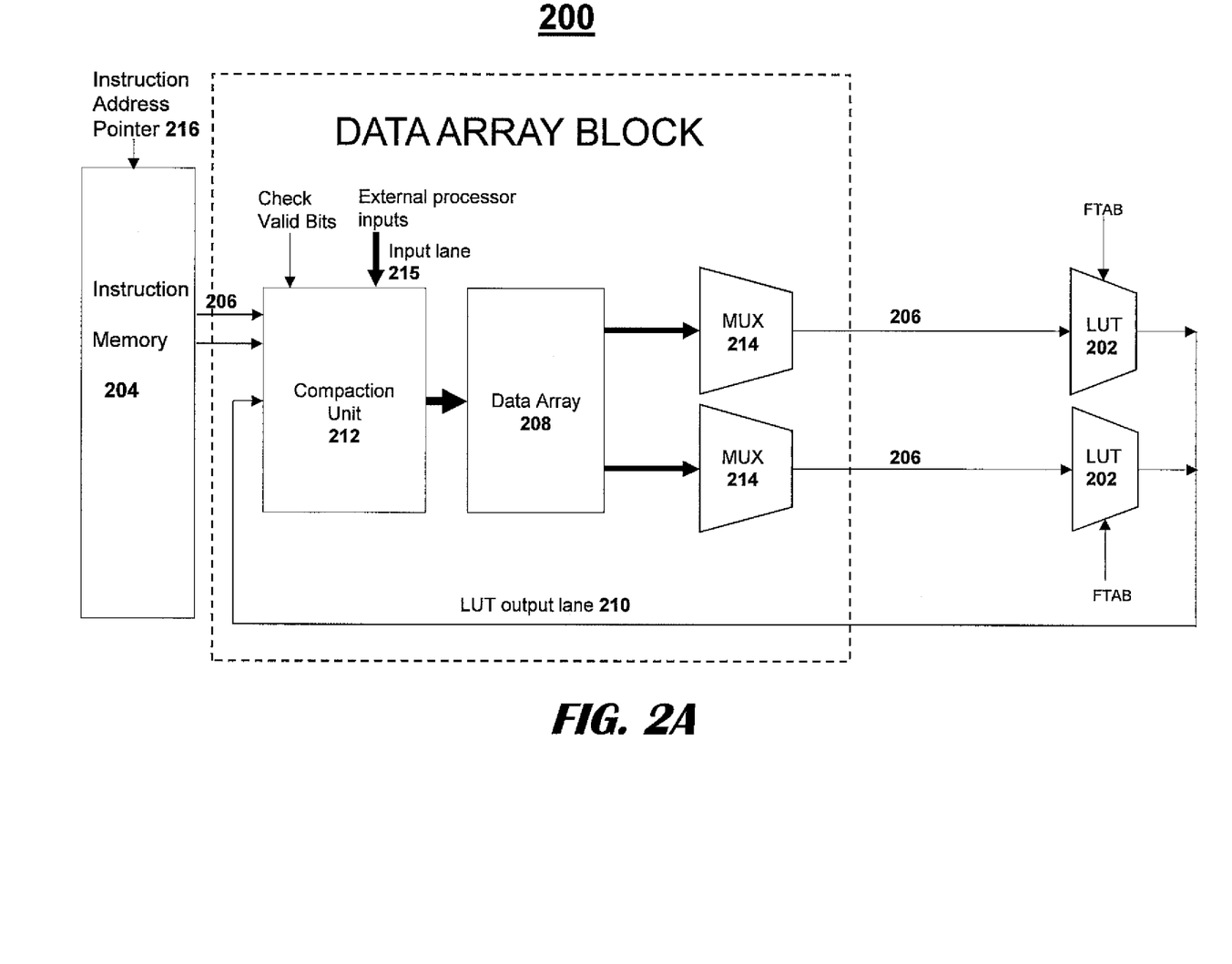
FIG. 2A is a schematic diagram showing components of a processor within an emulation chip, according to an exemplary embodiment.

FIG. 2A shows components of a processor 200 within an emulation chip, according to an exemplary system embodiment. Emulation chips disclosed herein are capable of performing programmatic logic functions used for hardware-based (e.g., processor-based) logic system emulation, which may allow for prototyping ASICs or other logic systems before actual production of the particular ASIC or logic system product. During execution of an emulation test, this programmatic logic may be executed by processors of the emulation chips.

A processor 200 may include one or more lookup tables (LUTs) 202, an instruction memory 204, and signal lanes 206 connecting the components of the processor 200 to one another and to external processors. In operation, the processor 200 may sequentially read instructions from a corresponding instruction memory 204 associated with the processor 200 that stores instructions for the processor 200 to execute. An instruction may contain bits that may be used by the processor 200 to determine which bits should be read from a data array 208 or other input source. The bits read from the data array 208 may then be fed to the LUT 202, which may be a particular type of multiplexer controlled by the current instruction. In another embodiment, the bits read from the data array 208 may be fed to the LUT 202 via a multiplexer (MUX) 214. The result of the LUT 202 performing its various functions may produce an output bit. In some cases, the output bit may be transmitted along a LUT output lane 210 to a compaction unit 212 for storage. In these cases, the compaction unit 212 store any number of output bits resulting from any number of previous LUT 202 evaluations. The compaction unit 212 then selects valid bits of the data obtained from the LUT output lane 210 and transfer the valid bits of data to the data array 208 for storage. Additionally or alternatively, the compaction unit 212 may also receive over a processor input lane 215, input bits arriving from a bit source external to the processor 200, including bits transmitted from other processors. The compaction unit 212 may then select valid bits from the input bits arriving from a bit source external from the processor 200 and transfer the valid bits of the input bits to the data array 208 for storage. Thus, the LUT 202 not only has access to previous results of the processor 200 stored in the data array 208, but the LUT 202 may also access values (e.g., input bits) from outside the processor 200.

A LUT 202 may be a circuit multiplexer (MUX) configured to represent (e.g., execute or otherwise perform) any Boolean function, thus allowing the emulation of most any function that could be produced by the logic system (e.g., ASIC, CPU, GPU, ALU) currently being emulated. The LUT 202 may represent any Boolean function that has a same number of inputs as a number of select inputs of the multiplexer. LUTs 202 with more inputs may require a larger number of data inputs to be stored, and more LUTs 202 may be required to perform the same Boolean function if the number of select inputs per LUT 202 is smaller.

The LUT 202 may include one or more circuit crossbars, which may comprise a set of one or more switches. It would be appreciated by one skilled in the art that the switches of the LUT 202 crossbars may be configured as a series of circuitry interconnects, which may be enabled or disabled according to a transistor or other component, such that the switches of the crossbar may select inputted data signals, perform logical functions on the selected data signals, and output data signals, when the transistor enables or disables certain interconnects.

An instruction set, stored in an instruction memory 204, may provide instructions to the circuitry of the LUT's 202 crossbars. In many cases, the Boolean functions capable of being executed by the LUT 202 have the same number of inputs (e.g., function parameters) as the number of select inputs leading into the LUT 202. For example, the LUT 202 may be a so-called "four-way" MUX that has four data inputs but only two select inputs. As such, by varying the values received from the four data inputs, the LUT 202 may allow the processor 200 to emulate any Boolean function that uses two bits. Likewise, the size of the Boolean functions that can be emulated using the LUTs 202 can be increased or decreased by adding or removing the number of select inputs fed into the LUTs 202. For example, in some embodiments, processors 200 of an emulation chip may comprise LUTs 202 with four inputs (e.g., "LUT4"), which allows each of these processors 200 to perform any four-bit Boolean function. However, it should be appreciated that there is no limitation upon the number of select inputs that are associated with the LUTs 202 of an emulation chip.

An emulation chip may further comprise an instruction memory 204, which may be a non-transitory, machine-readable storage media configured to store a set of instructions for the processor 200 to use for performing emulation functions. The emulation system may compile machine-readable code containing the functions of the logic system being emulated. The result of compilation is virtual logic containing the programmatic logic representing the functional designs of the emulated ASIC or other logic system. After compilation, the virtual logic is parsed into various instruction sets that may be distributed, or "downloaded," into the various instruction memories 204 of the emulation chips. During compilation, the instruction sets were generated with the expectation that the instruction sets will be provided to specific processors 200 or MUXs. As such, in many cases, the instruction sets are downloaded into predetermined instruction memories 204 according to the input and output destinations of the respective instructions of each instruction set. Upon compiling a netlist file representing the design of the logic system (e.g., ASIC, CPU, GPU) being tested, the resulting instruction set may be stored into the instruction memory 204, where each instruction is stored into an individual memory address within the instruction memory 204. An instruction address pointer 216 may identify each respective instruction address on behalf of processor 200, such that components of the processor 200 may retrieve and execute each individual instruction. In some embodiments, the processor 200 may be configured to sequentially execute each instruction, using an instruction address pointer 216. In such embodiments, the instruction address pointer 216 may be incremented as each sequential instruction is executed by the components of the processor 200.

The processor 200 may be associated with a data array 208 comprising non-transitory machine-readable storage media configured to store one or more input and/or output useful and valid data bits. In some cases, the data array 208 may be a component of the processor 200. In some cases, the data array 208 may be communicatively coupled to a plurality of processors 200, such that the data array 208 is accessible by a cluster of processors 200. The data array 208 may store valid results of the evaluations (e.g., LUT 202 valid function output) of the processor 200, or inputs to the processor 200 from external sources (e.g., external processors).

The data array 208 may comprise a number of single-bit read (e.g., input) ports (a plurality of read ports), often equal to the number of select inputs of the processor 200. The data array 208 may also have "write" ports, such as the write port to write the result of a LUT 202 evaluation, or the write port to receive processor 200 inputs from external sources. The data array 208 may have n write ports, where n is equal to the number of processors, and n×y read ports, where n is equal to the number of processors 200 and y is equal to the number of inputs into each processor 200. Each processor 200 is capable of accessing data stored in the data array 208 by another processor 200 during one emulation cycle. The data memory 205 may store a number of emulation steps that correspond to a clock-cycle of the ASIC, or other logic system, being emulated. The data stored in the data memory 205 may represent the state of the emulated ASIC or other logic system. In an embodiment, a control logic may be provided for providing control words to the data array 208 and the one or more processors 200. The control words may provide addresses to the data array 208 for accessing the data and provide the function of each processor 200.

A compaction unit 212 comprising non-transitory, machine-readable storage media is configured to store results of the evaluations (e.g., LUT 202 valid and invalid outputs) of the processor 200. The compaction unit 212 is configured to receive the data generated by the evaluations of the processor 200. Each bit of data generated by the evaluations of the processor 200 has an associated tag. The tag may include valid tag (for useful data outputs) or an invalid tag (for non-useful data outputs). The compaction unit 212 select bits of data from total bits of the data that has an associated valid tag. The compaction unit 212 may include algorithms to filter the bits of data with valid tags from the total bits of the data received from the evaluations of the processor 200 for each emulation cycle which may be N steps long (where N is an integer). The one or more bits of data that have valid tags are transmitted to the data array 208 by the compaction unit 212.

The compaction unit 212 may further be configured to receive the input bits arriving from a bit source external to the processor 200, including bits transmitted from other processors. Each bit of data received from the source external to the processor 200 may have an associated tag. The tag may include valid tag (for useful bits of data) or an invalid tag (for non-useful bits of data). The compaction unit 212 selects bits of data from total input bits of the data that have an associated valid tag. The compaction unit 212 may include algorithms to filter the bits of data with valid tags from the total input bits of the data received from the source external to the processor 200. The bits of data that have valid tags may then be transmitted to the data array 208 by the compaction unit 212. Thus, the data array 208 stores bits of data having a valid tag generated by the evaluations of the processor 200 and bits of data having a valid tag received from the source external to the processor 200. In one embodiment, the compaction unit 212 transmits the one or more valid bits of the data to the data array 208 when the received valid bits of the data reaches a pre-determined threshold. The pre-determined threshold for the compaction unit 212 may be programmable and selectable by a user at compile time. In one example, the pre-determined threshold may be reached when the compaction unit 212 determines that the compaction unit 212 has received at least one valid bit of data from each processor. In another example, the pre-determined threshold may be reached when the compaction unit 212 receives a pre-determined number (for example 100 bits) of valid bits of data. In such a case, when the total number of valid bits of the data exceeds 100, then the compaction unit 212 transmits 100 valid bits of the data to the data array 208. In yet another example, the pre-determined threshold may be reached when the compaction unit 212 receives valid of bits of data from a pre-determined number of instructions (for example 10 instructions). In such a case, when the compaction unit 212 receives the data from 10 instructions, then the compaction unit 212 selects the valid bits of the data from total data received in 10 instructions, and transmits valid bits of the data to the data array 208. It is to be noted that in another embodiment of the present disclosure, the compaction unit 212 may transfer the valid bits of the data to the data array 208 as soon as the compaction unit 212 determines that any given bit of data received has a valid tag associated with it without moving out from the scope of the disclosed embodiments.

In the illustrative embodiment, the pre-determined threshold number is reached when the total number of valid bits of data is equal to the total number of processors associated with the compaction unit 212. For example, if there are N number of processors associated with the compaction unit 212, then the pre-determined threshold number is reached when N number of valid bits of data is obtained. In another embodiment, the pre-determined threshold number is reached when the total number of valid bits of data comprises at least one bit associated with a valid tag from each processor 200. For example, when the compaction unit 212 receives from each processor of the one or more processors 200 at least one bit of data that has an associated valid tag, then the compaction unit 212 transmits the bits of data with the valid tag to the data array 208. The bits of data received by the compaction unit 212 that do not have the valid tag is stored in the compaction unit 212 or may be stored in an external memory by the compaction unit 212.

A sequencer (not shown) may be provided that supplies timing information to the emulation chip, provides read addresses to the instruction memory 204 and provides sequential write addresses to the data array 208. The sequencer starts at an initial value and increments to a maximal value. Each increment of the sequencer causes the step value to advance from zero towards the maximal value and is equivalent to an emulation step. Collectively, all of the emulation steps form one emulation cycle. An emulation cycle is complete once the sequencer reaches its maximal value. Upon reaching its maximal value, the sequencer begins counting again from its initial value and a new emulation cycle is initiated.

In some embodiments, multiple processors may be clustered together into processor clusters containing any number of processors. The clustering may facilitate expansion of the capabilities of the emulation system because the processors may have limitations on the number of logic system gates the processors can emulate. In some cases, clusters may be more efficient in prototyping functions of the logic system, such as an ASIC, because of the increased processing power and functionality. For example, a single processor may be able to emulate, at most, 1,280 logic gates (e.g., logical processes), but the ASIC or other logic system currently being tested has several million gates, all of which need to be emulated for proper circuit function and thorough testing. In some embodiments, clusters of processors may be clustered into "clusters of clusters." Clustered processors communicate with each other by sending their LUT evaluations out to other processors in the cluster.

In an example embodiment, the processor cluster may comprise a cluster of four processors. A processor cluster may often comprise one or more multiplexers that share a common data array or other some other resource. In some cases, clusters may be capable of performing increasingly more complex logical functions. As such, clusters may be capable of prototyping increasingly more complex functions of a logic system (e.g., ASIC, CPU, GPU). As with individual processors, the exemplary processor cluster of an emulation chip comprises any number of multiplexers that perform simple Boolean computations, according to a control logic program or simple set of logical rules, which may be in an instruction memory as instruction sets. In the cluster, however, the multiplexers may share a single data array, and may also output larger results to the same destination resource. This allows for the cluster to emulate more intricate functions of the prototype logic system, such as an ASIC, because more bits may be processed, stored, or output, thus more complex functions may be modeled.

It should be appreciated that clusters of processors for a given emulation chip may be formed into any organizational structure, and that nothing described herein should be construed as limiting on the possible organizational structure of the resources. In some cases, for example, clusters may be clustered, thereby forming clusters of cluster.

In the exemplary processor cluster, a common compaction unit may capture the output of every processor in the processor cluster for a whole emulation cycle (comprising many steps). The compaction unit then filters the bits of the data that are valid, and writes the valid bits of the data into a common data array. Such a configuration allows increased number of valid bits of the data to be stored in the common data array in each emulation cycle without increasing a size of the common data array of the processor cluster.

The inputs to the processors can use the value produced by any processor in the cluster that was produced up to one emulation cycle before. In the exemplary processor cluster, the common data array goes from being one bit wide, to being N bits wide (where N is the number of processors in the processor cluster). The word indicated by the current step number is where the processors valid outputs are stored. The read address encoded in the current instruction contains a step number portion and a processor number portion to read from the common data array.

Figure 2B:
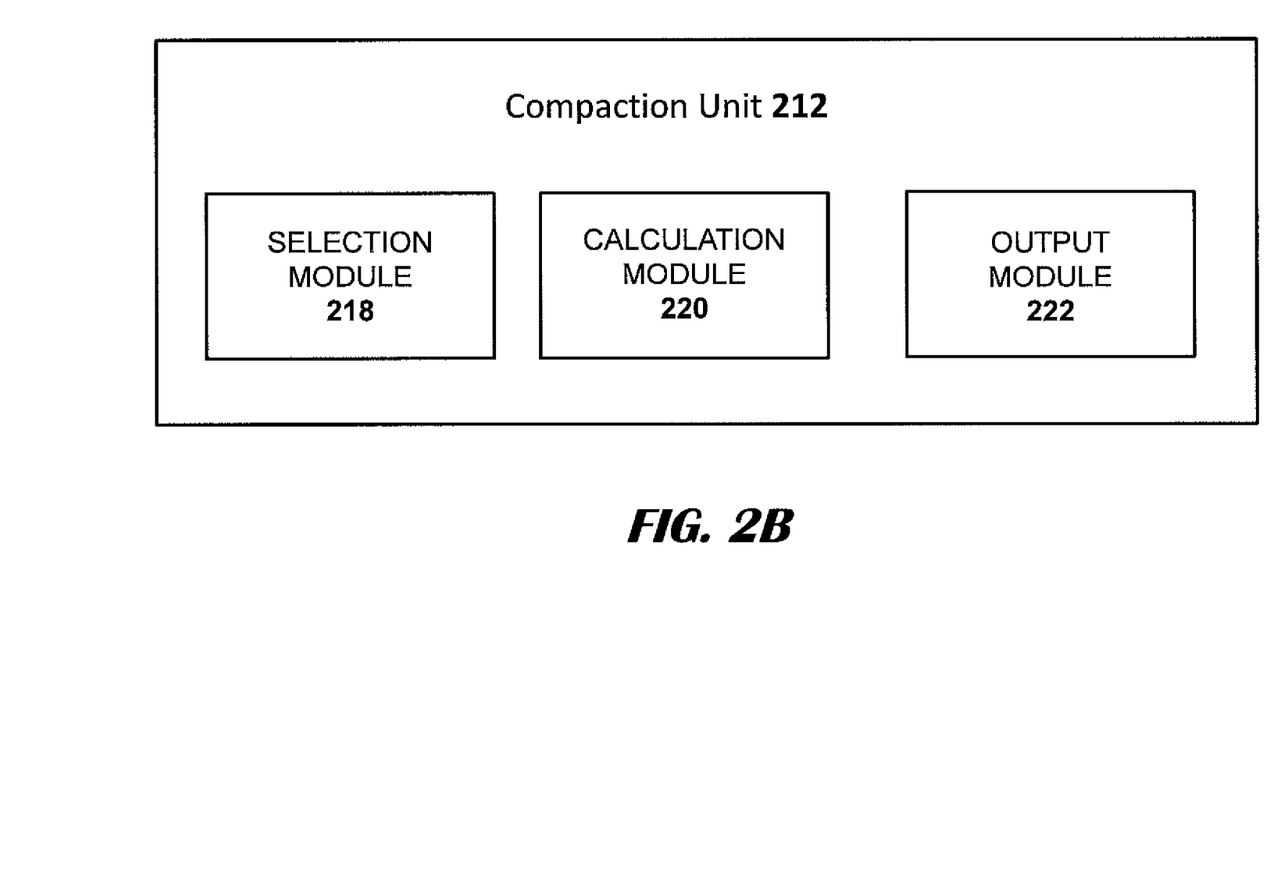
FIG. 2B is a schematic diagram showing components of a compaction unit of a processor within an emulation chip, according to an exemplary embodiment.

FIG. 2B shows components of a compaction unit 212 of a processor 200 within an emulation chip that will explained in conjunction to a normal mode of operation of the processor 200 of FIG. 2A. During a normal mode of operation, output of the processor 200 are written into the compaction unit 212. The output of the processor 200 may include one or more bits of data for each instruction executed. In one embodiment, only a single processor output may be written into the compaction unit 212. In another embodiment, outputs from multiple processors of a processor cluster may be written into the compaction unit 212. For example, for a processor cluster with N processors, on every step, the compaction unit 212 receives N processor output bits and N associated tags. The tags may include valid tags or invalid tags.

A selection module 218 of the compaction unit 212 selects output bits of data that has associated valid tags and filters the processor output bits that has invalid tags. In an embodiment, the selection module 218 selects the output bits of the data that has valid tags for received from each of the processor 200 simultaneously. In another embodiment, the selection module 218 selects the output bits of the data that has valid tags for received from each of the processor 200 independently. In yet another embodiment, the selection module 218 may include programs to verify whether the valid tags are actually valid or not. When the selection module 218 verifies that the bits of the data are tagged correctly, then the selection module 218 filter the bits of the data with valid tags from the total bits of the data received from the processor 200. The output bits of the processor 200 that have invalid tags may be stored in an external memory. A calculation module 220 of the compaction unit 204 calculates the total number of the output bits of data that have associated valid tags selected by the selection module 218. The output module 220 of the compaction unit 212 then outputs the processor valid output bits when the compaction unit 212 has accumulated at least N valid processor output bits such that at least one valid output bit is obtained from each processor 200. The N valid processor output bits are then written to the data array 208 by the output module 220.

Figure 3:
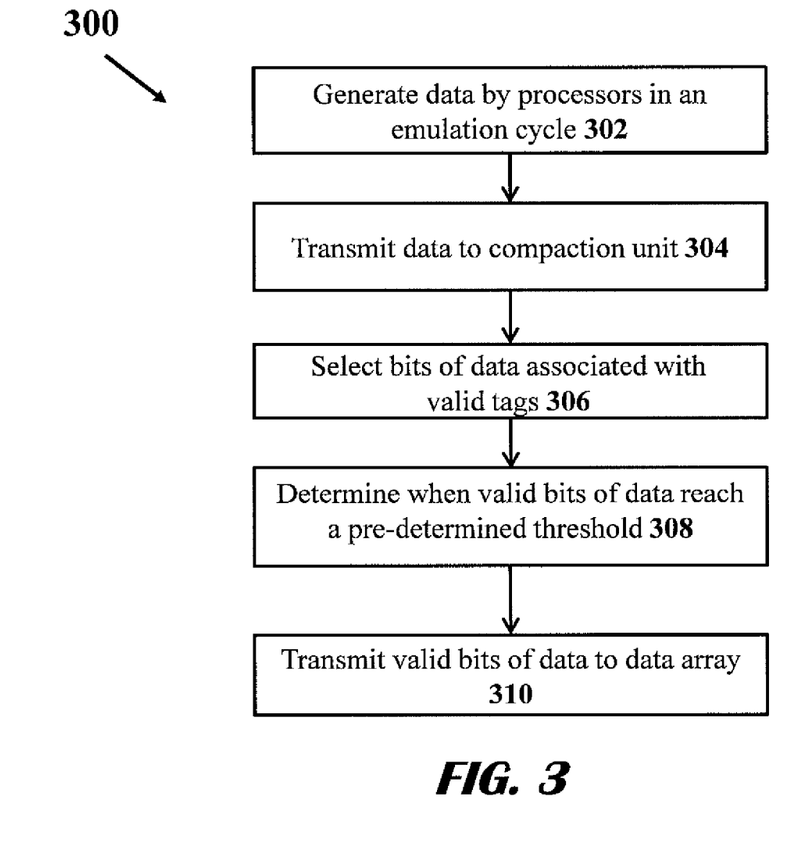
FIG. 3 shows a method for transfer data in an emulation system, according to an exemplary embodiment.

FIG. 3 shows a method 300 for transfer data in an emulation system, according to an exemplary embodiment. In step 302, a processor may sequentially read instructions from an instruction memory associated with the processor that stores instructions for the processor to execute. An instruction may contain bits that may be used by the processor to determine which bits should be read from a data array or other input source. In another embodiment, the processor may receive an instruction word from its associated memory. The instruction word comprises a read address for a location in a data array. The processor then retrieves data from the data array using the read address provided by the instruction word. The instruction word may also include an operating instruction for evaluating the data retrieved from the data array. The processor evaluates the data in accordance with the instruction word. In order to evaluate the data, the data read from the data array may then be fed to the LUT, which may be a particular type of multiplexer controlled by the current instruction. In another embodiment, the bits read from the data array may be fed to the LUT via a multiplexer (MUX). The result of a LUT performing its various functions may produce an output bit.

In step 304, the output bit is transmitted along a LUT output lane to a compaction unit for storage. The compaction unit stores any number of output bits resulting from any number of previous LUT evaluations. Each bit of data generated by the evaluations (LUT outputs) of the processor may have an associated tag. The tag may correspond to a valid tag or an invalid tag. In an embodiment, the output bit may be stored in the compaction unit at a write address provided by the sequencer. In another embodiment, the output bit may be stored at a write address in the compaction unit that is specified by a field in the instruction word.

In step 306, the compaction unit receives an instruction word from its associated memory. The instruction word enables the compaction unit to select one or more bits from total bits of the data that has valid tags obtained from the LUT output lane. In step 308, the compaction unit calculates total number of valid bits obtained from the processors. In step 310, the compaction unit transmits the one or more bits of the data to the data array when the one or more bits of the data is at least equal to or greater than a pre-determined threshold number. In one embodiment, the pre-determined threshold number is reached when the total number of valid bits of data is equal to the total number of processors associated with the compaction unit. For example, if there are N number of processors associated with the compaction unit, then the pre-determined threshold number is reached when N number of valid bits of data is obtained. In the illustrated example, the compaction unit on obtaining N bits of data that has an associated valid tag, transmits the bits of data with the valid tag to the data array. In another embodiment, the pre-determined threshold number may be reached when the total number of valid bits of data comprises at least one bit associated with a valid tag from each of the processor. For example, when the compaction unit receives from each processor of the one or more processors at least one bit of data that has an associated valid tag, then the compaction unit transmits the bits of data with the valid tag to the data array. The portion of data received by the compaction unit that do not have the valid tag is stored in the compaction unit or may be stored in an external memory by the compaction unit.

One of the benefits the configuration of emulation system described above is that the ability for the data array to store increased number of valid bits produced by the processors, while the size of the data array does not increase. The illustrative embodiments show that an increase in instructions of 15 to 25% will not result in an increase in the present amount of data stored in a data array as the data array will only store valid bits. This allows the hardware emulator to emulate more steps per cycle, without an increase in the size of the data array within the hardware emulator. Also, the current configuration reduces the power needed for writing the data produced by the processors into the data array since in the current configuration every bit of the data is not written into the data array and only valid bits of the data is written into the data array. This allows the saving of power as invalid bits are not written.

Figure 4A:
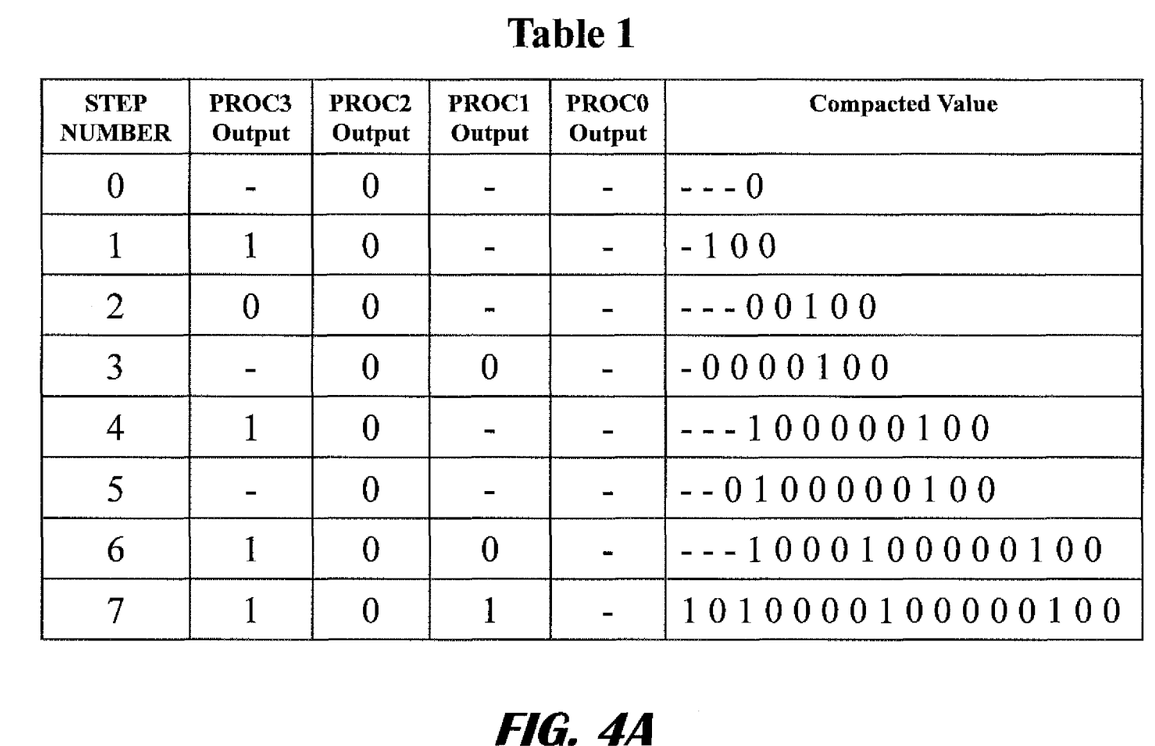
FIG. 4A shows a table of output produced by each processor in a four processor cluster in an emulation system, according to an exemplary embodiment.

FIG. 4A shows a table of output produced by each processor in a four processor cluster in an emulation system, according to an exemplary embodiment. In one embodiment, a hardware emulator is comprised of four processors. The four processors are arranged into groups of processors known as clusters, and the clusters of four processors collectively comprise the emulation engine. Each of the four processors are capable of emulating one or more logic gates, and mimicking the function of logic gates in an integrated circuit. The four processors may be arranged to compute results in parallel, in the same way logic gates present in an integrated circuit compute many results in parallel.

The valid output of each of the four processors or input to the emulator is stored in a memory known as a data array such that the valid output can be used by any of the any four processor or some other device. The data array has a single read/write port. The output from a read port of the data array provides a single bit of input to a processor. In the illustrated example, each of the four processors has, for example, four inputs. The four processors have been grouped together into clusters and share the common data array. Each of the four processors produces one output per instruction during each emulation step as represented in the FIG. 4A. The output produced maybe a valid output or invalid output. In Table 1, "1" and "0" represents valid processor output and "-" represents invalid processor output.

During the normal operation of the four processor cluster of the emulation system, a programmatic logic may be executed by each of the four processors of the emulation chips. The programmatic logic executed by the four processors in the hardware emulator consist of instructions containing a sequence of operations. The processor corresponds to an instruction memory that is read sequentially, and provides instructions that are used to read bits out of the data array. The processor utilizes multiple input ports for receiving data from the data array, and then evaluate the data supplied from the data array in accordance with an instruction word supplied from an instruction memory. The bits of data that are read from the data array are fed to a lookup table (LUT) that is controlled by the instruction, and in each clock cycle for each step, each of the 4 processors produces output. The output produced maybe a valid processor output such as 1 or 0 or invalid output. The output produced by each of the four processors is shown in "Compacted value" section of the Table 1. For each subsequent step, the valid processor output are pushed to the right of the valid processor outputs produced in a preceding step.

Figure 4B:
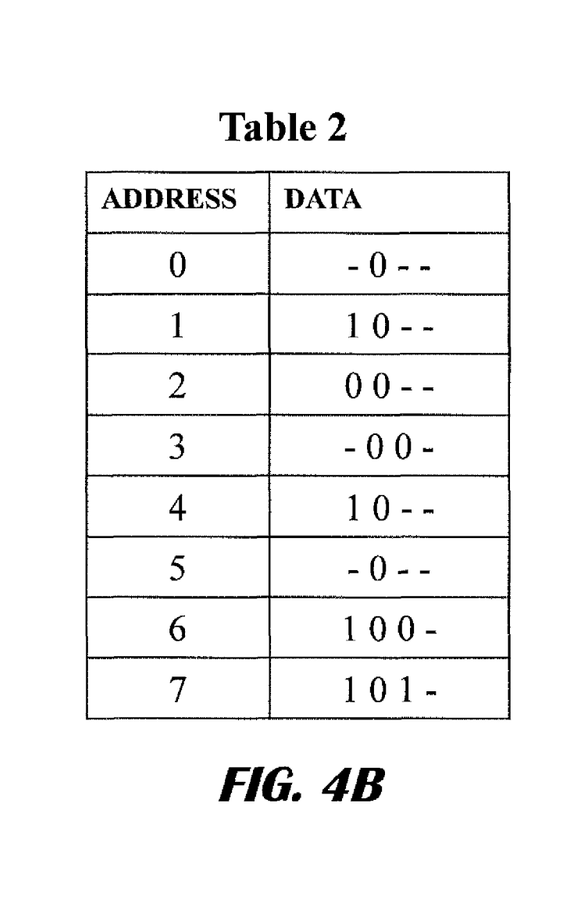
FIG. 4B shows a table of output produced by each processor in a four processor cluster in an emulation system stored in a compaction unit, according to an exemplary embodiment.

FIG. 4B shows a table of output produced by each processor in a four processor cluster in an emulation system stored in a compaction unit, according to an exemplary embodiment. The output of each of the four processor cluster is sent by an output port of the processors to a compaction unit. The compaction unit may operate as a buffer memory to store all outputs produced by the four processor cluster. The outputs may include valid/useful and invalid/not useful outputs as shown in Table 2. In Table 2, "1" and "0" represents valid processor output and "-" represents invalid processor output.

Figure 4C:
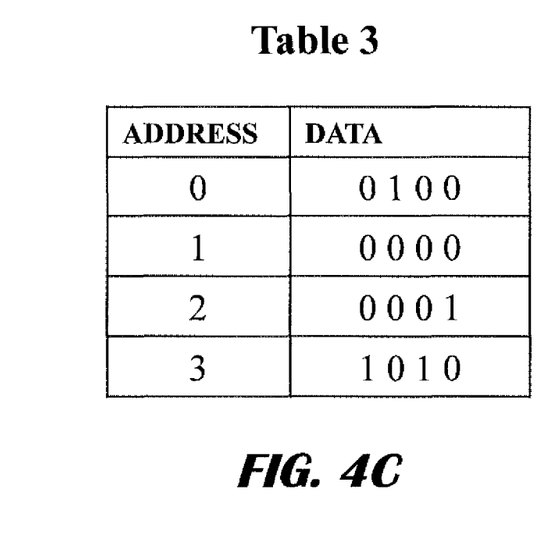
FIG. 4C shows a table of output produced by each processor in a four processor cluster in an emulation system stored in a data array, according to an exemplary embodiment.

The compaction unit selects valid bits of processor outputs from total data received from each of the four processors, and then transmits the valid bits of the data ("1" and "0") to the data array. Such a configuration of the data array allows the data array to store only valid bits of data ("1" and "0") as shown in Table 3 of the FIG. 4C. Therefore, the use of the compaction unit allows the data array of present disclosure to store only the valid bits of the data and that allows the data array to store outputs for 20 percent or more instructions in comparison to conventional techniques employed to store data in the data array per instruction for the same size of the data array.

In one embodiment, in the current configuration of the data array of the emulation system, the address of the output of the processor is dependent on the previous instructions executed by the processors in the four processor cluster. For example, if a processor in the four processor cluster uses an input that is stored in the data array, in order to find the location of that value of the input, previous instructions may be examined in order to determine the location of the input bit and then program the instructions read address. The address of the input bit is statically determined once the instructions are programmed. In another embodiment, when only the data for a single emulation cycle is stored, bit 0 of word 0 may contain the output of a first valid instruction in the emulation cycle. Other addresses of the data can be calculated from based on the first valid instruction.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A hardware emulator of an emulation system configured to store an increased number of useful bits produced during multiple emulation cycles, the hardware emulator comprising:
    one or more processors configured to generate data in an emulation cycle, each bit of the data is associated with a tag;
    a compaction unit comprising a first non-transitory machine-readable storage media configured to receive and store the data generated by the one or more processors, and select, during a runtime of the hardware emulator, one or more bits from total bits of the data based on valid tags associated with the one or more bits of the data; and
    a data array comprising a second non-transitory machine-readable storage media configured to store the one or more bits of the data received from the compaction unit, wherein the compaction unit is configured to transmit the one or more bits of the data associated with the valid tags to the data array upon the compaction unit receiving a threshold number of bits with a valid tag.

2. The hardware emulator according to claim 1, wherein the compaction unit is configured to transfer the one or more bits of the data to the data array when a total number of the one or more bits of the data is at least equal to or greater than a pre-determined threshold number.

3. The hardware emulator according to claim 1, wherein the compaction unit is further configured to receive input bits of data arriving from a bit source external to the one or more processors, and select one or more bits from total input bits of the data based on valid tags associated to the one or more bits of the data.

4. The hardware emulator according to claim 1, wherein the compaction unit is configured to remove bits from the total bits of data that are invalid determined based on their associated tags and store in an external memory.

5. The hardware emulator according to claim 1, further comprising at least one instruction memory for providing an instruction word to the one or more processors.

6. The hardware emulator according to claim 1, wherein the one or more processors are coupled to the data array, and configured to emulate logic gate functions during the emulation cycle using the data as stored in the data array.

7. The hardware emulator according to claim 1, further comprising a control logic for providing control words to the data array and the one or more processors, wherein the control words provide addresses to the data array for accessing the data and provide the function of each processor.

8. The hardware emulator according to claim 1, wherein the data array has one write port.

9. The hardware emulator according to claim 1, wherein the data array has a plurality of read ports.

10. The hardware emulator according to claim 1, further comprising a sequencer for providing a write address to the data array.

11. A processor-implemented method for transfer of data in an emulation system having a data array configured to store increased number of useful bits produced during multiple emulation cycles, the method comprising:
    generating, by one or more processors, data in an emulation cycle, each bit of the data is associated with a tag;

receiving, by a compaction unit, the data generated by the one or more processors, wherein the compaction unit stores the data;

selecting, by the compaction unit during a runtime of the emulation system, one or more bits from total bits of the data based on valid tags associated to the one or more bits of the data; and transmitting, by the compaction unit, the one or more bits of the data having the valid tags to the data array comprising a non-transitory machine-readable storage media when the compaction unit receives a threshold number of the bits having the valid tag, wherein the data array stores the one or more bits of the data received from the compaction unit.

12. The method according to claim 11, further comprising transmitting, by the compaction unit the one or more bits of the data to the data array when a total number of the one or more bits of the data is at least equal to or greater than a pre-determined threshold number.

13. The method according to claim 11, further comprising:

receiving, by the compaction unit, input bits of data from a bit source external to the one or more processors; and selecting one or more bits from total input bits of the data based on valid tags associated to the one or more bits of the data.

14. The method according to claim 11, further comprising removing, by the compaction unit bits from the total bits of data that are invalid determined based on their associated tags and store in an external memory.

15. The method according to claim 11, wherein at least one instruction memory provides an instruction word to the one or more processors.

16. The method according to claim 11, wherein the one or more processors are coupled to the data array, and configured to emulate logic gate functions during the emulation cycle using the data as stored in the data array.

17. The method according to claim 11, wherein a control logic is configured to provide control words to the data array and the one or more processors, wherein the control words provide addresses to the data array for accessing the data and provide the function of each processor.

18. The method according to claim 11, wherein the data array has one write port.

19. The method according to claim 11, wherein the data array has a plurality of read ports.

20. The method according to claim 11, further comprising providing, by a sequence, a write address to the data array.

* * * * *